United States Patent [19]

Rahim

[11] Patent Number: 4,533,877
[45] Date of Patent: Aug. 6, 1985

[54] TELECOMMUNICATION OPERATIONAL AMPLIFIER

[75] Inventor: Chowdhury F. Rahim, Bridgewater, N.J.

[73] Assignee: AT&T Bell Laboratories, Murray Hill, N.J.

[21] Appl. No.: 566,822

[22] Filed: Dec. 29, 1983

[51] Int. Cl.³ .............................................. H03F 3/45
[52] U.S. Cl. ..................................... 330/253; 330/261
[58] Field of Search ........................ 330/252, 253, 261

[56] References Cited

PUBLICATIONS

R. C. Jaeger, Active Load for Differential Amplifiers, IBM Technical Disclosure Bulletin vol. 16, No. 10, Mar. 1974, pp. 3140-3141.

Primary Examiner—James B. Mullins
Assistant Examiner—G. Wan
Attorney, Agent, or Firm—Lucian C. Canepa

[57] ABSTRACT

A single stage high performance operational transconductance amplifier consists of a pair of p-channel load field effect transistors, a pair of n-channel type cascode field effect transistors, a pair of n-channel differential field effect transistors and an n-channel current source field effect transistor. This amplifier has improved performance in terms of noise and power supply rejection as compared to conventional CMOS amplifiers.

1 Claim, 3 Drawing Figures

U.S. Patent   Aug. 6, 1985   4,533,877

TELECOMMUNICATION OPERATIONAL AMPLIFIER

TECHNICAL FIELD

This invention relates to operational amplifiers useful in the telecommunications field and in particular to operational transconductance amplifiers suited for use with switched capacitor filters.

BACKGROUND OF THE INVENTION

Many of today's conventional complementary metal-oxide-silicon (CMOS) field effect transistor (FET) operational amplifiers obtain the needed high gain by using two stages, with each stage comprising a pair of load devices, a differential pair of devices and a current source, or by using a single stage amplifier having a pair of load devices, two separate pairs of cascode devices, a differential pair of devices and a current source. These types of amplifiers typically require large compensation capacitors which result in a greater settling time and more noise than is desired in some applications. Another problem with these types of amplifiers is that variations in the magnitude of the power supply voltages used cause a loss of operating margins which cannot be easily tolerated in some applications.

It is desirable to have a CMOS operational transconductance amplifier which has relatively high gain, has relatively low noise, has relatively good power supply rejection, has moderate output impedance, and has relatively short settling time.

SUMMARY OF THE INVENTION

The present invention is essentially directed to a CMOS differential transconductance amplifier which comprises essentially the combination of first and second p-channel load field effect transistors (T1 and T2), third and fourth n-channel cascode field effect transistors (T3 and T4), fifth and sixth differential n-channel field effect transistors (T5 and T6), and a seventh current source n-channel field effect transistor (T7). First output terminals of the T1 and T2 transistors are coupled to a first power supply VDD and a second output terminal of T7 is coupled to a second power supply VSS. The gate terminals of T1 and T2 are coupled to a first reference potential V1; the gate terminals of T3 and T4 are coupled to a second reference potential V2; and the gate terminal of T7 is coupled to a third reference potential V3. The gates of T5 and T6 are coupled to complementary amplifier input terminals VIN1 and VIN2. The second output terminals of T1 and T2 are coupled to first output terminals of T3 and T4, respectively, which serve as complementary amplifier output terminals VOUT1 and VOUT2. The second output terminals of T3 and T4 are coupled to the first output terminals of T5 and T6, respectively. The second output terminals of T5 and T6 are coupled to the first output terminal of T7.

The amplifier of the present invention, when used with the voltage generators described hereinafter, has relatively high gain (typically 1000 or greater) and low noise (less than 500 nanovolts/ $\sqrt{Hz}$ at KHz), and less than 20 nanovolts/ $\sqrt{Hz}$ at 100 KHz), has relatively good power supply rejection (greater than 60 db from both power supplies at base band), has unity gain bandwith of 1.5 MHz with a 12 picofarad load capacitance, and has relatively short settling time (0.5 microsecond with a 12 picofarad load capacitance).

Viewed from another aspect, the present invention is directed to an amplifier comprising first and second load devices (T1 and T2), essentially only third and fourth (T3 and T4) cascode switching devices, fifth and sixth (T5 and T6) differential switching devices, and a current source. Each of the devices has a control terminal and first and second output terminals. A first output terminal of the current source is coupled to the second output terminals of T5 and T6. The control terminals of T5 and T6 serve as amplifier input terminals VIN1 and VIN2. The second output terminals of T1 and T2 are coupled to the first output terminals of T3 and T4, respectively, and to first and second amplifier output terminals VOUT1 and VOUT2, respectively. The second output terminals of T3 and T4 are coupled to the first output terminals of T5 and T6, respectively.

These and other features and advantages of the invention are better understood from a consideration of the following detailed description taken in conjunction with the accompanying drawings.

DETAILED DESCRIPTION

Figure 1:
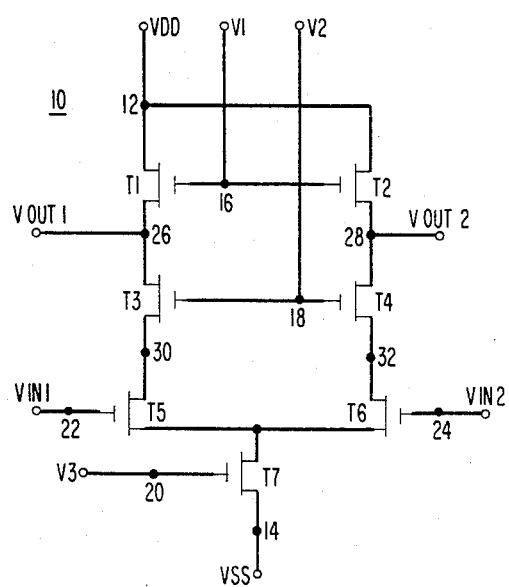
FIG. 1 illustrates an amplifier in accordance with an embodiment of the present invention.
Figure 2:
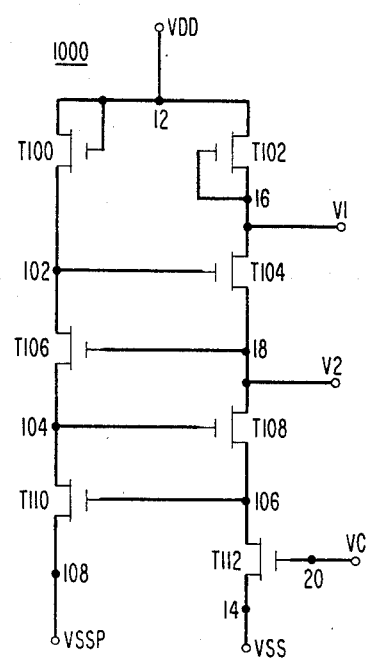
FIG. 2 illustrates first voltage generator circuitry useful with the amplifier of FIG. 1.

Referring now to FIG. 1, there is illustrated an amplifier 10 in accordance with the present invention which includes first and second load devices comprising field effect transistors T1 and T2, third and fourth cascode switching devices comprising field effect transistors T3 and T4, fifth and sixth differential devices comprising field effect transistors T5 and T6, and a current source comprising field effect transistor T7. The gates of T1 and T2 are coupled to terminal 16 and to a first reference potential V1 and the gates of T3 and T4 are coupled to a terminal 18 and to a second reference potential V2. V1 and V2 are generated by voltage generator circuitry 1000 which is illustrated in FIG. 2 herein and which is the subject of a separate patent application which is being filed concurrently with the present application as U.S. patent application Ser. No. 566,823 (C. F. Rahim Case 2) and which has a common assignee. The gate of T7 is coupled to a terminal 20 and to a third voltage reference V3 which is generated by voltage generator circuitry illustrated in FIG. 3 herein and which is the subject of a separate U.S. patent application known as U.S. patent application Ser. No. 593,522, filed Mar. 26, 1984 (S. K. Kim-E. J. Zimany Case 3-2), which has a common assignee.

In a preferred embodiment, T1 and T2 are p-channel insulated gate field effect transistors and T3, T4, T5, T6, and T7 are n-channel insulated gate field effect transistors. The sources of T1 and T2 are coupled together to a terminal 12 and to a power supply VDD. The source of T7 is coupled to a terminal 14 and to a power supply VSS. The gate terminal of T5 is coupled to a terminal 22 and to a first source of input signals VIN1. The gate terminal of T6 is coupled to a terminal 24 and to a second source of input signals VIN2. VIN1 and VIN2 provide complementary input signals. The drains of T1 and T3 are coupled to a terminal 26, and to a first output terminal VOUT1 of amplifier 10. The drains of T2 and T4 are coupled to a terminal 28, and to a second output terminal VOUT2 of amplifier 10. VOUT1 and VOUT2 have complementary output signals and either one or both may be used in any particular application. The source of T3 is coupled to the drain of T5 and to a terminal 30. The source of T4 is coupled to the drain of T6 and to a terminal 32. The sources of T5 and T6 are coupled to a terminal 34 and to the drain of T7. The drain and source terminals of a field effect or metal-oxide-silicon transistor change as a function of the direction of current flowing therethrough. The drain and source terminals may be referred to as first and second or second and first output terminals of the transistor with the gate referred to as a control terminal. The transistors may be referred to as switching devices or just devices. T1 and T2 may be denoted as load devices; T3 and T4 may be denoted as cascode devices or cascode switching devices; T5 and T6 may be denoted as a differential pair, differential switching devices, or just devices. T7 may be denoted as a current source or current source device or a switching device.

Referring now to FIG. 2, there is illustrated voltage generator circuitry 1000 which generates at an output terminal 16 a V1 output voltage level and generates at an output terminal 18 a V2 output voltage level. V1 and V2 are the voltage levels used by amplifier 10 of FIG. 1. Circuitry 1000 comprises field effect transistors T100, T102, T104, T106, T108, T110, and T112.

The drain and gate of T100 and the source of T102 are coupled to terminal 12 and to power supply VDD. The gate and drain of T102 are coupled to the drain of T104 and to a terminal 16 at which reference potential V1 is generated. The source of T100, the gate of T104, and the drain of T106 are all coupled to a terminal 102. The source of T104, the gate of T106, and the drain of T108 are all coupled to a terminal 18 at which the reference potential V2 is generated. The source of T106, the gate of T108, and the drain of T110 are all coupled to a terminal 104. The source of T108, the gate of T110, and the drain of T112 are all coupled to a terminal 106. The gate of T112 is coupled to terminal 20 and to a reference potential V3. The source of T112 is coupled to terminal 14 and to power supply potential VSS. The source of T110 is coupled to a terminal 108 and to a source of potential VSSP. VSSP is typically approximately 0.7 volts more positive in potential than VSS.

Circuitry 1000 is designed to provide amplifier 10 of FIG. 1 with the needed reference potentials V1 and V2. The physical size, type of transistor, and threshold voltage of T102 is selected to be essentially identical to those of T1 and T2. The physical size, type of transistor, and threshold voltage of T104 is selected to be essentially identical to those of T3 and T4. The physical size, type of transistor, and threshold voltage of T108 is selected to be essentially identical to those of T5 and T6. The serial connection of T102, T104, and T108 is very similar to the serial connection of T1, T3, and T5, and to the serial connection of T2, T4, and T6. The current level generated through T102, T104, and T108 is essentially identical to the current levels through T1, T3, and T5, and through T2, T4, and T6. T112 is one-half the size of T7 and has the same applied gate potential, V3, and source potential, VSS, as has T7. The current generated by T7 is essentially twice that generated through T112; however, only half of the current through T7 flows through T1, T3, and T5, and the other half flows through T2, T4, and T6. The combinations of T1, T3, T5, and T7, and T2, T4, T6, and T7, and T102, T104, T108, and T112 are all coupled at one end to VDD and at the other end to VSS. All of these common characteristics tend to result in output voltages V1 and V2 of voltage generator circuitry 1000 being compensated for semiconductor processing variations, assuming that amplifier 10 and voltage generator circuitry 1000 are fabricated together in a single silicon chip and use the same supply.

As will be discussed subsequently herein, variations in the potential level of VSS are compensated for by corresponding changes in the level of V3 by voltage generator circuitry 1000 of FIG. 2. Accordingly, variations in the level of VSS essentially cause no change in the current level through the combinations of T1, T3, T5, and T7, and T2, T4, T6, and T7, and T102, T104, T108, and T112. Typically VSSP is generated from VSS using a clipper circuit (not illustrated). This helps ensure that voltage variations of VSS do not result in corresponding voltage variations in the level of VSSP. This contributes to keeping the current level through T100, T106, and T110 relatively constant and thus helps maintain output voltage references V1 and V2 at the desired levels.

Typically the current flowing through T102, T104, T108, and T112 is significantly greater than that that flows through T100, T106, and T110. This results in the voltage needed, ΔV, above the threshold voltage of each of the transistors T100, T106, and T110, to conduct a preselected current within the saturation region of operation, to be significantly less than the corresponding ΔV of each of T102, T104, and T108. This, combined with the feedback configuration of T104, T106, T108, and T110, results in the potential of V2 being as separated from V1 as is reasonably possible such that all transistors of amplifier 10 operate in the saturation region but such that the widest reasonably possible output voltage swings occur at output terminals VOUT1 and VOUT2 of amplifier 10. This serves to tend to maximize the dynamic range of amplifier 10.

In some applications it is desirable to provide input terminals VIN1 and VIN2 of amplifier 10 with a common d-c offset level. The potential appearing at terminal 104 is at one such level and as such can be coupled to VIN1 and VIN2 through separate n-channel field effect transistors (not illustrated).

Figure 3:
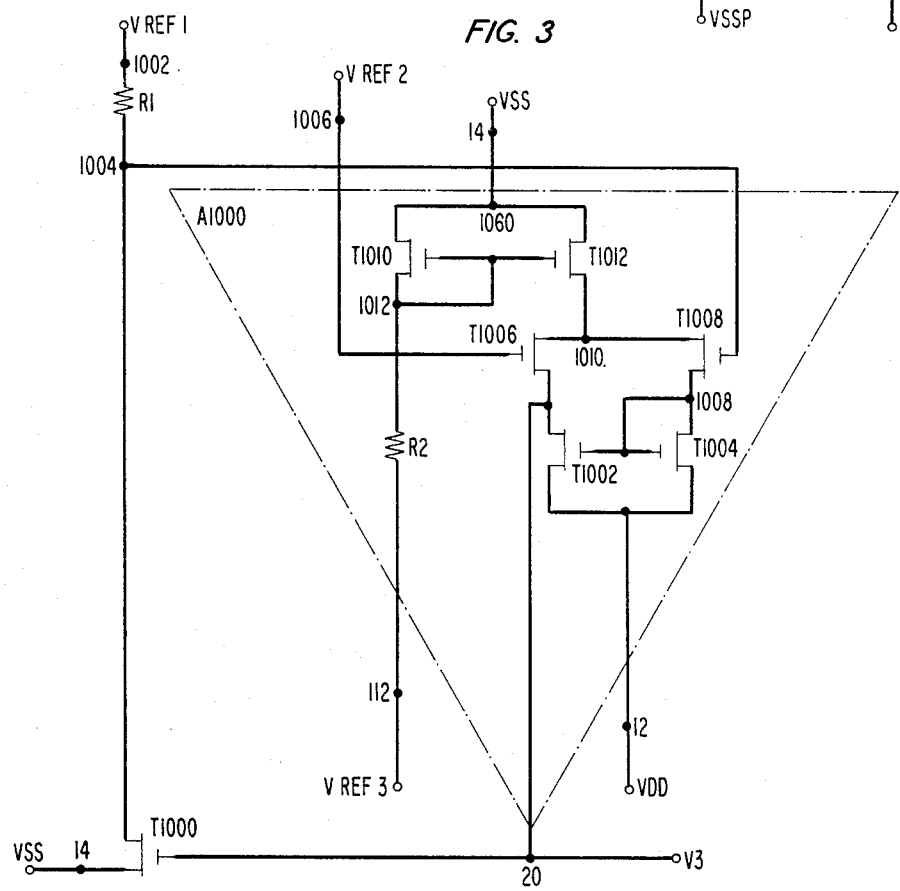
FIG. 3 illustrates second voltage generator circuitry useful with the amplifier of FIG. 1.

Referring now to FIG. 3, there is illustrated voltage generator circuitry which generates at an output terminal 20 the reference voltage V3 needed by amplifier 10 of FIG. 1 and by voltage generator circuitry 1000 of FIG. 2. The circuitry of FIG. 3 comprises a first resistor R1, a switching device which comprises a field effect transistor T1000, and an operational amplifier which is illustrated in dashed line triangle A1000 and will be denoted as as A1000. A first terminal of R1 is coupled to a terminal 1002 and to a reference potential V Ref1. A second terminal of R1 is coupled to a first input terminal of A1000, to the drain of T1000 and to a terminal 1004. Output terminal 20 of A1000 is coupled to the gate of T1000 and serves as the output terminal at which reference potential V3 is generated. The source of T1000 is coupled to terminal 14 and power supply potential VSS. A second input terminal of A1000 is coupled to a terminal 1006 and to a reference potential Vref2 which is typically ground (0 volts).

The voltage generator circuitry of FIG. 3 generates at output terminal 20, a potential V3 which varies with any variations of VSS such that the current through T1000 and through T7 of amplifier 10 of FIG. 1, and through T112 of voltage generator circuitry 1000 of FIG. 2 remains essentially constant even with variation in the potential level of VSS. VRef1 is generated typically by circuitry (not illustrated) which is powered by VDD and VSS. This circuitry is designed to provide a VRef1 level which is tightly regulated and varies little even if there is variation in the levels of VDD and VSS. Accordingly, VRef1 contributes little variation in output voltage V3.

Amplifier A1000 is illustrated as comprising n-channel IGFETS T1002 and T1004 and p-channel IGFETS T1006, T1008, T1010, and T1012. The drains of T1002 and T1004 are coupled to terminal 12 and to VDD. The sources of T1002 and T1006 are coupled to the gate of T1000, and to output terminal 20. The gates of T1002 and T1004 are coupled to the sources of T1004 and T1008 and to a terminal 1008. The gate of T1006 is coupled to a terminal 1006 and to a reference potential VRef2. The gate of T1008 is coupled to terminal 1004. The drains of T1006 and T1008 are coupled to the source of T1012 and to a terminal 1010. The drains of T1010 and T1012 are coupled to terminal 14 and VSS. The gates of T1010 and T1012 are coupled to the source of T1010, to a first terminal of a resistor R2, and to a terminal 1012. A second terminal of R2 is coupled to terminal 12 and to a reference potential VRef3.

A variety of different types of differential amplifiers or operational differential amplifiers can be used other than the specific circuitry illustrated. In this particular embodiment, VRef2 and VRef3 are the same. The voltage reference generator shown in FIG. 3 is the subject of the aforecited U.S. patent application Ser. No. 593,522 (S. K. Kim-E. J. Zimany Case No. 3-2).

Amplifier 10 of FIG. 1, voltage generator 1000 of FIG. 2, and the voltage generator of FIG. 3 have been fabricated in a single silicon chip and tested and found to be fully functional. In the fabricated chip VDD = +5 volts, VSS = −5 volts, V1 = 2.12 Volts, V2 = 2.0 volts, V3 = −4.0 volts, VSSP = −4.3 volts, VRef1 = VRef3 = 2.75 volts, VRef2 = 0 volts, R1 = 135,000 ohms, and R2 = 25,000 ohms. Transistors T1, T2, T3, T4, T5, T6, T7, T100, T102, T104, T106, T108, T110, T112, T1000, T1006, T1008, T1010, T1012, T1002, and T1004 are of p, p, n, n, n, n, n, n, p, n, n, n, n, n, p, p, p, p, n, and n-channel, respectively. The average d-c level of VIN1 and VIN2 is −2.75 volts and the average input a-c voltage swing is approximately ±3 millivolts. The average d-c level at VOUT1 and VOUT2 is 0 volts and the output voltage swing is approximately ±3.5 volts. The open loop gain of amplifier 10 is approximately 3000. The unity gain bandwidth is approximately 12 MHz with a load capacitance of 12 picofarads on each of terminals 26 and 28. The equivalent input rms noise is 12 nanovolts/$\sqrt{Hz}$ (Broadband). The power supply rejection for VDD using a 1 KHz signal is 68 db; using a 10 KHz signal is 65 db; and using a 100 KHz signal is 58 db. The power supply rejection for VSS using a 1 KHz signal is 84 db; using a 10 KHz signal is 75 db; and using a 100 KHz signal is 57 db.

The embodiments described herein are intended to be illustrative of the general principles of the present invention. Various modifications are possible consistent with the spirit of the invention. For example, T1 and T2 can be n-channel transistors and T3, T4, T5, T6, and T7 can be p-channel transistors. Still further, T1 and T2 could be standard integrated circuit or discrete resistors or pinch resistors. Still further, T1 and T2 could be resistors and T3, T4, T5, T6, and T7 could be bipolar transistors. Still further, a variety of different type current sources can be substituted for T7.

What is claimed is:

1. An amplifier comprising:

first and second load devices each having first and second terminals;

third and fourth cascode switching devices each having a control terminal and first and second terminals;

fifth and sixth differential switching devices each having a control terminal and first and second terminals;

a current source coupled by a first terminal to the second terminals of the fifth and sixth differential switching devices;

the control terminals of the differential pair of switching devices being coupled to first and second amplifier input terminals, respectively;

the second terminals of the first and second load devices being coupled to the first terminals of the third and fourth cascode switching devices, respectively, and being adapted to be coupled to first and second amplifier output terminals, respectively;

the second terminals of the third and fourth cascode switching devices being coupled to the first terminals of the fifth and sixth differential switching devices, respectively;

each of the first, second, third, fourth, fifth, and sixth devices comprising a separate field effect transistor having a gate terminal corresponding to the control terminal, and having first and second terminals corresponding to the first and second terminals of the devices;

the first and second transistors being n-channel or p-channel transistors and the third, fourth, fifth, and sixth transistors being of the opposite channel type of the first and second transistors;

the first terminals of the first and second transistors being coupled together and being adapted to be connected to a first power supply;

the gate terminals of the first and second transistors being coupled together and being adapted to be connected to a first reference potential;

the gate terminals of the third and fourth transistors being coupled together and being adapted to be connected to a second reference potential;

the current source comprising a seventh field effect transistor of opposite channel type as the first and second transistors, and having a gate terminal and first and second terminals;

the first terminal of the seventh transistor being coupled to the second terminals of the fifth and sixth transistors;

the second terminal of the seventh transistor being connectable to a second power supply;

the gate terminal of the seventh transistor being connectable to a third reference potential;

the first, second, and third reference potentials being generated by first, second, and third reference sources which each comprise field effect transistors;

and wherein each of the first, second, and third reference sources comprises n-channel and p-channel transistors and the amplifier and all three reference sources are fabricated in a single semiconductor chip and each of the three reference sources and the amplifier are connectable to the same first and second power supplies.

* * * * *